US006853000B2

(12) United States Patent
Felber et al.

(10) Patent No.: US 6,853,000 B2
(45) Date of Patent: Feb. 8, 2005

(54) TEST STRUCTURE FOR DETERMINING A DOPING REGION OF AN ELECTRODE CONNECTION BETWEEN A TRENCH CAPACITOR AND A SELECTION TRANSISTOR IN A MEMORY CELL ARRAY

(75) Inventors: Andreas Felber, München (DE); Valentin Rosskopf, Pöttmes (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/675,051

(22) Filed: Sep. 30, 2003

(65) Prior Publication Data

US 2004/0061110 A1 Apr. 1, 2004

(30) Foreign Application Priority Data

Sep. 30, 2002 (DE) .......................................... 102 45 533

(51) Int. Cl.[7] .............................................. H01L 29/72
(52) U.S. Cl. ........................... 257/48; 257/201; 257/304
(58) Field of Search ........................... 257/48, 201, 304

(56) References Cited

U.S. PATENT DOCUMENTS

| 6,288,558 B1 | 9/2001 | Zimmermann et al. |
| 2004/0056248 A1 * | 3/2004 | Liu et al. ....................... 257/48 |

FOREIGN PATENT DOCUMENTS

DE          101 07 081 A1       9/2001

* cited by examiner

*Primary Examiner*—Edward Wojciechowicz
(74) *Attorney, Agent, or Firm*—Laurence A. Greenberg; Werner H. Stemer; Gregory L. Mayback

(57) ABSTRACT

A test structure for a memory cell array determines a doping region of an electrode connection that, in a memory cell, connects an inner capacitor electrode of a trench capacitor to an associated selection transistor. The test structure has an electrical contact with a predetermined contact area disposed between a regular matrix configuration of four trench capacitors.

9 Claims, 5 Drawing Sheets

TEST STRUCTURE FOR DETERMINING A DOPING REGION OF AN ELECTRODE CONNECTION BETWEEN A TRENCH CAPACITOR AND A SELECTION TRANSISTOR IN A MEMORY CELL ARRAY

BACKGROUND OF THE INVENTION

Field of the Invention

The invention relates to a test circuit for a memory cell array for determining a doping region of an electrode connection which, in a memory cell, connects an inner electrode of a trench capacitor to an associated selection transistor.

Semiconductor memories, in particular dynamic random access semiconductor memories (DRAMs), are composed of a matrix of memory cells which are connected up in the form of rows via word lines and columns via bit lines. Data are read from the memory cells or data are written to the memory cells by the activation of suitable word and bit lines. A dynamic memory cell is generally composed of a selection transistor and a storage capacitor. The selection transistor is usually configured as a horizontally configured field-effect transistor and contains two diffusion regions separated by a channel above which a control electrode, a so-called gate, is disposed. The gate is in turn connected to a word line. One of the diffusion regions of the selection transistor is connected to a bit line and the other diffusion region is connected to the storage capacitor. Through the application of a suitable voltage to the gate via the word line, the selection transistor turns on and enables a current flow between the diffusion regions in order to charge the storage capacitor via the connected bit line.

One objective in DRAM memory development is to achieve the highest possible yield of memory cells with good functionality in conjunction additionally with a minimum chip size. Ongoing endeavors to miniaturize the DRAM memory cells have led to the configuration of memory cells in which, in particular, the storage capacitor utilizes the third dimension. One three-dimensional storage capacitor concept is that of trench capacitors containing a trench which is etched into the semiconductor substrate and is filled with a highly conductive material serving as an inner capacitor electrode. By contrast, the outer capacitor electrode is generally formed in a buried manner as a diffusion region in the substrate, the outer capacitor electrode is contact-connected via a further layer formed in a buried manner in the semiconductor substrate, a so-called buried plate. The buried plate layer is usually contact-connected in the edge region via a contact opening, a so-called plug. The electrical connection between the diffusion region of the selection transistor and the inner capacitor electrode of the trench capacitor in a memory cell is effected in the upper trench region by an electrode connection usually formed as a diffusion region, the so-called buried strap.

In order to keep the chip size as small as possible, it is an objective to embody in particular also the edge region of the memory cell arrays with the plug for the connection of the buried plate as far as possible in a space-saving manner. In this case, there is the risk that the plug for the connection of the buried plate will make contact with the buried straps of trench capacitors if the plug region overlaps the buried strap doping region. The consequence of this is that a short circuit occurs between the capacitor electrodes of the trench capacitors, and leads to a total failure of the complete memory chip. To date, such a short circuit has generally only been able to be ascertained by complicated physical fault analysis. Furthermore, such a fault analysis can also only be performed in the back-end, i.e. after essentially the entire fabrication process for the memory chip has been run through. Furthermore, the size of the doping region of the buried strap significantly influences the electrical behavior of the memory cell and in this case has an influence in particular on the storage capacitance to be charged and the charge speed. Therefore, precise knowledge of the buried strap doping extent is of crucial importance for determining the performance features of the memory cells. To date, however, the size of the buried strap doping region has only been able to be determined on the basis of complicated and expensive doping profile analyses.

SUMMARY OF THE INVENTION

It is accordingly an object of the invention to provide a test structure for determining a doping region of an electrode connection between a trench capacitor and a selection transistor in a memory cell array that overcomes the above-mentioned disadvantages of the prior art devices of this general type, by which it is possible, in a simple manner, to determine a buried strap doping of the trench capacitors and to detect, in particular, short circuits between the buried outer capacitor electrode and the buried strap.

With the foregoing and other objects in view there is provided, in accordance with the invention, a test structure for a memory cell array having trench capacitors disposed in matrix form, for determining an extent of buried strap doping regions. A buried strap doping region, in a memory cell, serves as an electrode connection of an inner capacitor electrode of a trench capacitor with an associated selection transistor. The test structure contains an electrical contact having a predetermined contact area and is disposed between a regular matrix configuration of four of the trench capacitors.

Each of the trench capacitors has an inner capacitor electrode, a dielectric layer, an outer capacitor electrode isolated from the inner capacitor electrode by the dielectric layer and is disposed around a lower trench region. The buried strap diffusion region embodied as the electrode connection of the inner capacitor electrode is disposed in an upper trench region.

According to the invention, the test structure is provided for a memory cell array in which the trench capacitors of the memory cells are disposed in matrix form. The test structure determines a doping region of an electrode connection. The doping region, in a memory cell, connects an inner capacitor electrode of a trench capacitor to an associated selection transistor. The test structure has an electrical contact with a predetermined contact and is disposed between a regular matrix configuration of four trench capacitors. The test structure according to the invention makes it possible in a simple manner to ascertain exactly and non-destructively the doping extent of an upper electrode connection by a simple measurement of the current flow between the electrical contact and the inner capacitor electrodes of the trench capacitors disposed around the electrical contact. If there is an overlap between the electrically conductive contact and the buried strap doping region, it is possible to ascertain an electrical current flow. By contrast, no current flow occurs in the case where no overlap is present. From the position of the electrical contact relative to the four trench capacitors, the size and form of the contact area and the current flow between the electrical contact and the trench capacitors surrounding it, it is possible to make an exact statement about the buried strap doping region. Furthermore, it is then also possible to ascertain by what extent at least the electrical contact of the buried plate in the edge region of the memory chip has to be spaced apart from the trench capacitors in order to prevent a short circuit between the electrical contact and the buried strap or whether such a contact in the edge region overlaps a buried strap of a trench capacitor and thus effects a short circuit between the capacitor electrodes and hence a total failure of the memory chip.

In accordance with one preferred embodiment, the regular matrix configuration of four trench capacitors with the electrical contacts disposed in between is embodied within a regular memory cell array. Since the test structure, like the regular memory cell structure, is generally fabricated with the aid of planar technology containing a sequence of lithography processes, the embedding of the test structure in a regular memory cell array ensures that the trench capacitors essentially correspond to the regular trench capacitors of the memory cell matrix since the test structure, during the individual lithography steps, has the same surroundings as the regular memory cell structure. The reliability and meaningfulness of the test measurement are significantly improved as a result.

In accordance with a further preferred embodiment, an active region of a selection transistor is provided below the electrical contact between the regular matrix configuration of four trench capacitors. This ensures that the test structure is modeled on the regular memory cell array construction as far as possible, in order to enable an exact statement with regard to the extent of the buried strap doping region.

In accordance with a further preferred embodiment, the four trench capacitors are connected to separate contact areas that enable simple contact-connection of the inner capacitor electrode of the respective trench capacitor. This configuration makes it significantly easier to carry out the measurement since the trench capacitors, for the purpose of testing, can be connected via loose contact areas that are far apart from one another and can be linked to an evaluation unit in a simple manner with the aid of a needle card.

In accordance with a further preferred embodiment, provision is made of a test structure pattern having a multiplicity of test structures, the test structures being formed with different spacings between the trench capacitors and/or a different size of the contact area. This results in the possibility of defining the region of the buried strap doping in a highly precise and accurately scaled manner.

Other features which are considered as characteristic for the invention are set forth in the appended claims.

Although the invention is illustrated and described herein as embodied in a test structure for determining a doping region of an electrode connection between a trench capacitor and a selection transistor in a memory cell array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
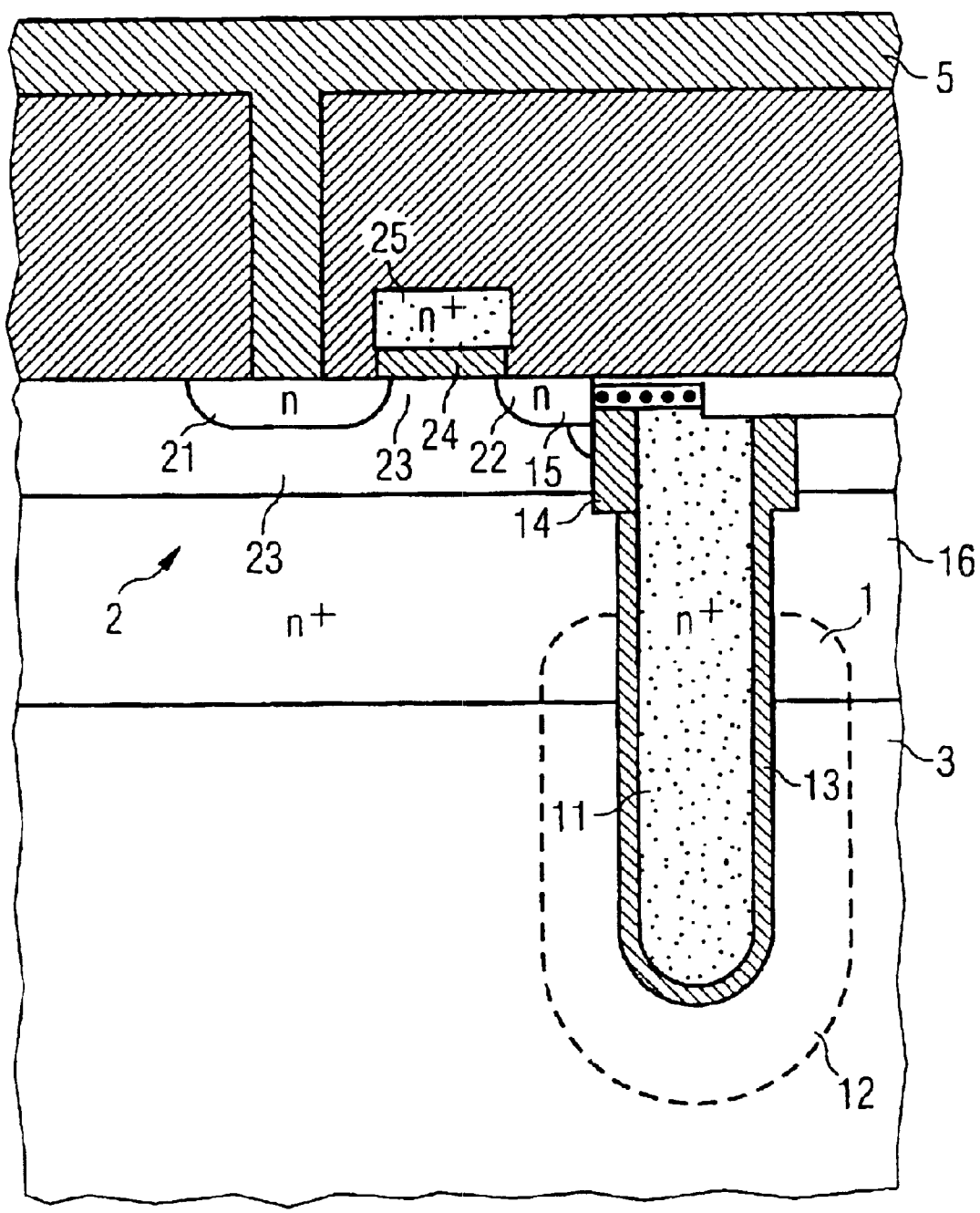
FIG. 1 is a diagrammatic, cross-sectional view of a DRAM memory cell with a trench capacitor.

Referring now to the figures of the drawing in detail and first, particularly, to FIG. 1 thereof, there is shown an example of a DRAM memory chip for explaining the invention. Individual structures of the dynamic memory cells in the chip are preferably formed with the aid of silicon planar technology containing a sequence of individual processes which each act over the whole area on the surface of a silicon semiconductor wafer, a local alteration of the silicon substrate being carried out in a targeted manner by suitable masking steps. A multiplicity of dynamic memory cells are formed simultaneously during the DRAM memory fabrication. The construction of an individual DRAM memory cell is described briefly below with reference to FIG. 1.

A DRAM memory cell is composed of a storage capacitor 1 and a selection transistor 2. In this case, the selection transistor 2 is preferably formed as a planar field-effect transistor, for example as an n-type field-effect transistor. The n-type field-effect transistor 2 has two n-doped diffusion regions 21, 22 in a p-doped semiconductor substrate 3. The two diffusion regions 21, 22 serve as source and drain regions, a semiconductor substrate region 23 lying in between representing an active region of the transistor 2. Disposed above the active region 23, in a manner isolated by an insulation layer 24, is a highly n-doped gate electrode 25, which acts like a plate capacitor with which a charge density in the active region 23 can be influenced in order to form or block a current-conducting region between the first electrode 21 and the second electrode 22.

In dynamic memory cells, the storage capacitors used are preferably trench capacitors in order to achieve a significant reduction of the memory cell area by the three-dimensional structure. The trench capacitor 1 has a deep trench with an aspect ratio, i.e. a width/depth ratio, of up to 1:10. The trench is filled with a highly doped layer, a polysilicon layer in the embodiment shown, which serves as an inner capacitor electrode 11. An outer capacitor electrode 12 is formed as a highly n-doped diffusion region 12 in the lower trench region around the inner capacitor electrode 11.

The outer capacitor electrode 12 may be produced for example by thermal outdiffusion of a highly doped layer in the trench. The outer capacitor electrode 12 is isolated from the inner capacitor electrode 11 by a dielectric layer 13. In the upper trench region, the dielectric layer 13 is preferably extended to form a widened insulation collar 14. Furthermore, in the upper trench region, an electrode connection 15, a so-called buried strap, is provided between one electrode 22 of the field-effect transistor 2 and the inner capacitor electrode 11 of the trench capacitor. The electrode connection 15 may be produced in a similar manner to the outer capacitor electrode 12 by thermal outdiffusion of a highly doped layer introduced in an upper trench region. The outer capacitor electrode 12 is in turn connected by a capacitor plate 16, a so-called buried plate, which is preferably common to all the outer capacitor electrodes of the DRAM memory cell configuration. The buried plate 16, which is highly n-doped in the embodiment shown, is usually contact-connected in an edge region of the memory cell array through a contact opening, preferably a metal plug.

The first electrode 21 of the field-effect transistor 2 is furthermore connected to a bit line 5 in order that the information stored in the trench capacitor 1 in the form of charges can be read in and out. In this case, the read-in and read-out operation is controlled via a word line, which is at the same time the gate electrode 25 of the field-effect transistor 2, in order, through the application of a voltage, to produce a current-conducting channel in the active region 23 between the first electrode 21 and the second electrode 22.

In order to be able to make DRAM memory chips as small as possible, it is an objective to embody in particular also the memory chip edge region with the contact to the buried plate 16, which makes contact with the outer capacitor electrodes 12 of the trench capacitors 1, as far as possible in a space-saving manner. This gives rise to the risk that the metal plug for the contact-connection of the buried plate will overlap in particular the doping region of the buried strap of the adjoining trench capacitor, so that a short circuit occurs between the inner capacitor electrode 11 of the trench capacitor and the buried plate 16 adjoining the outer capacitor electrodes 12 of the trench capacitors 1, which may lead to a total failure of the memory chip. In order to ascertain such a short circuit between the capacitor electrodes above the buried plate, a complicated physical fault analysis in the back-end, that is to say after the completion of the memory chip, has been necessary to date. Furthermore, the extent of the doping region of the buried strap linkage of the inner capacitor electrode of the trench capacitor to the selection transistor crucially influences the electrical behavior of the memory cell. To date, determining the magnitude and position of the buried strap doping has only been possible on the basis of complicated and expensive doping profile analyses.

FIGS. 2 to 5 show a test structure according to the invention for determining the region of an outdiffusion of a buried strap of a trench capacitor. The test structure is preferably formed in a kerf region, i.e. in the intermediate region on a wafer between two DRAM chips. In this case, the test structure according to the invention makes it possible to determine the buried strap outdiffusion or possible short circuits between the buried plate 16 and the buried strap 15 as early as in a process stage which directly follows the fabrication of the trench capacitors, that is to say in the front-end of the memory chip fabrication. In this case, the test structure can be realized in a simple manner by a functional augmentation in the context of the previous memory cell test structure in the front-end.

Figure 3:
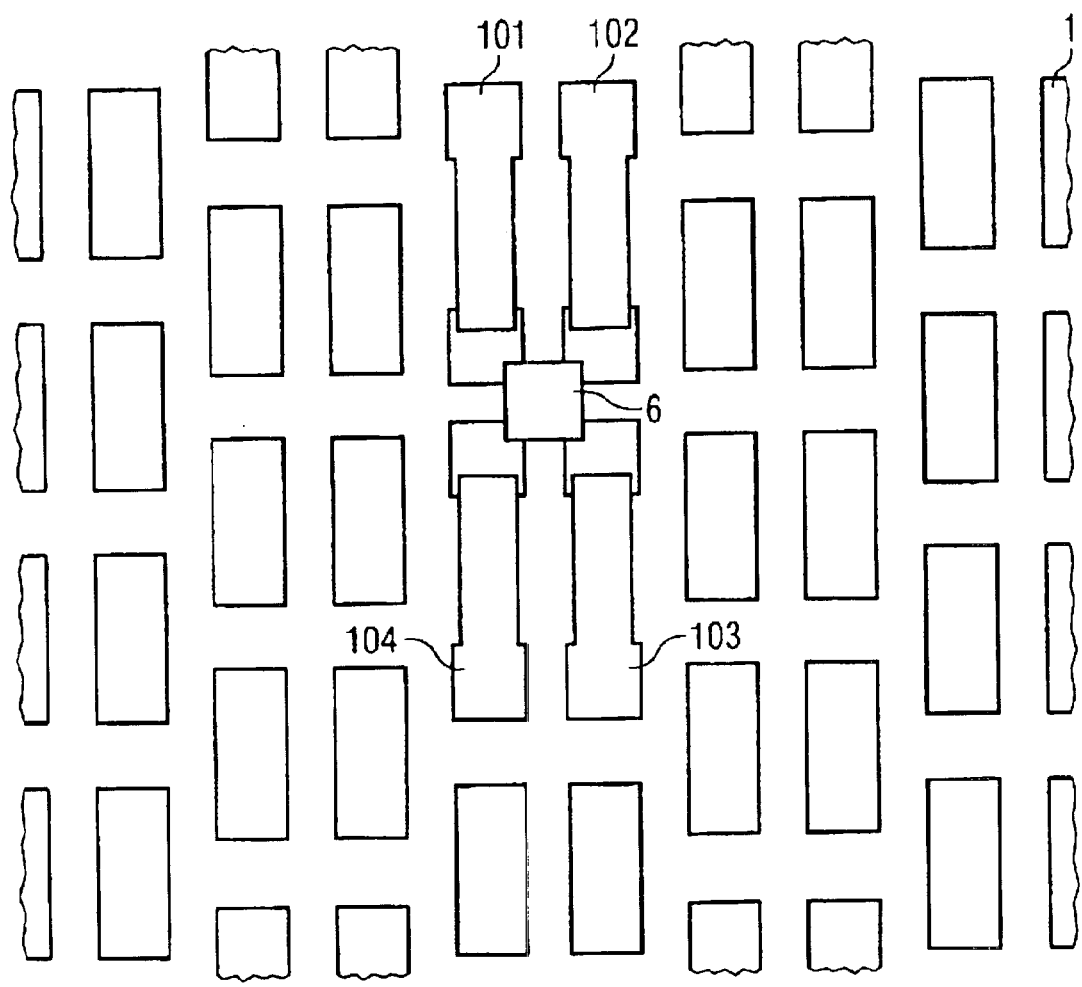
FIG. 3 is a plan view of the test structure according to the invention with a matrix configuration of trench capacitors and an electrical test contact.
Figure 4:
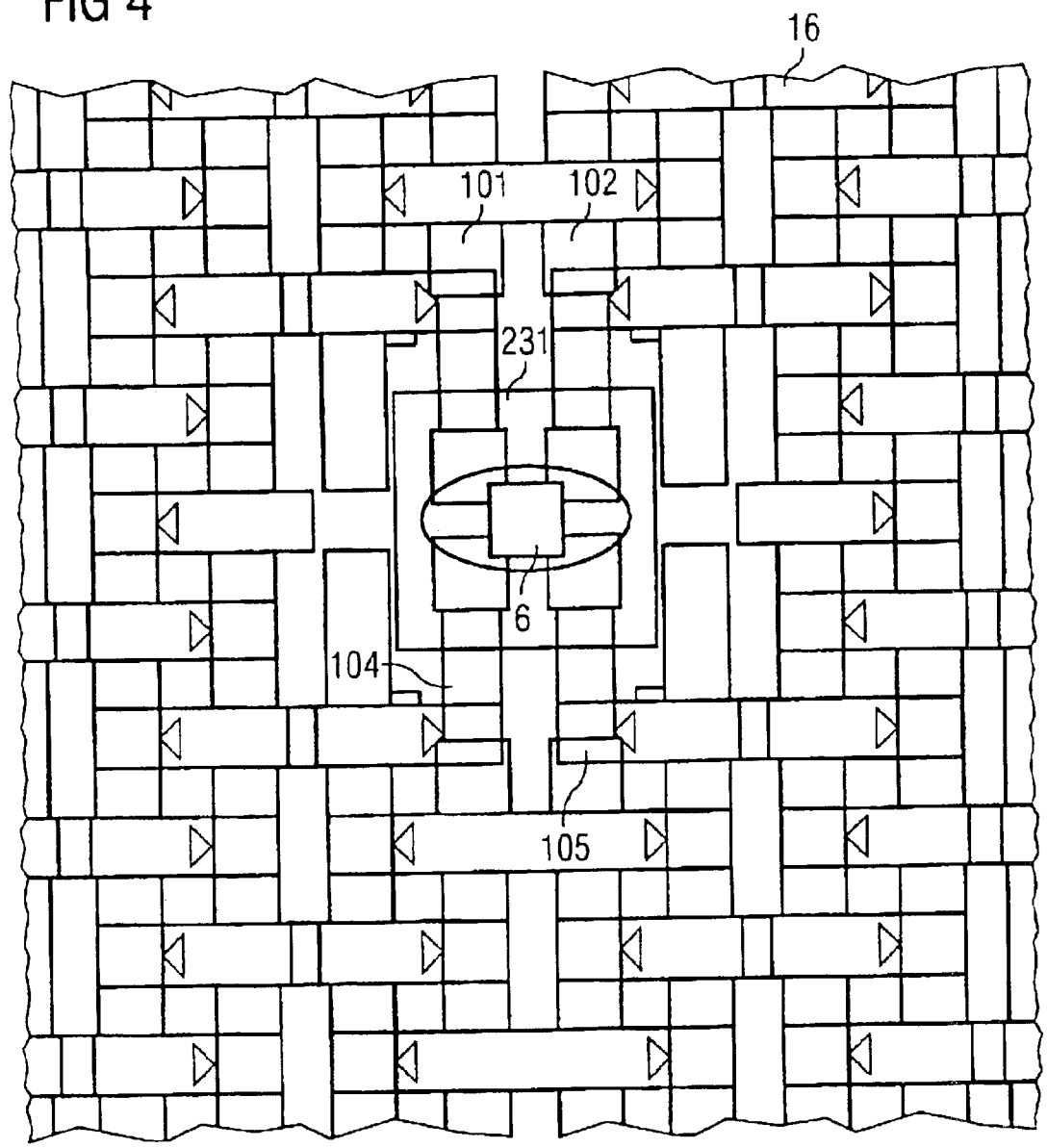
FIG. 4 is a plan view starting from FIG. 3 with additionally provided active regions.
Figure 5:
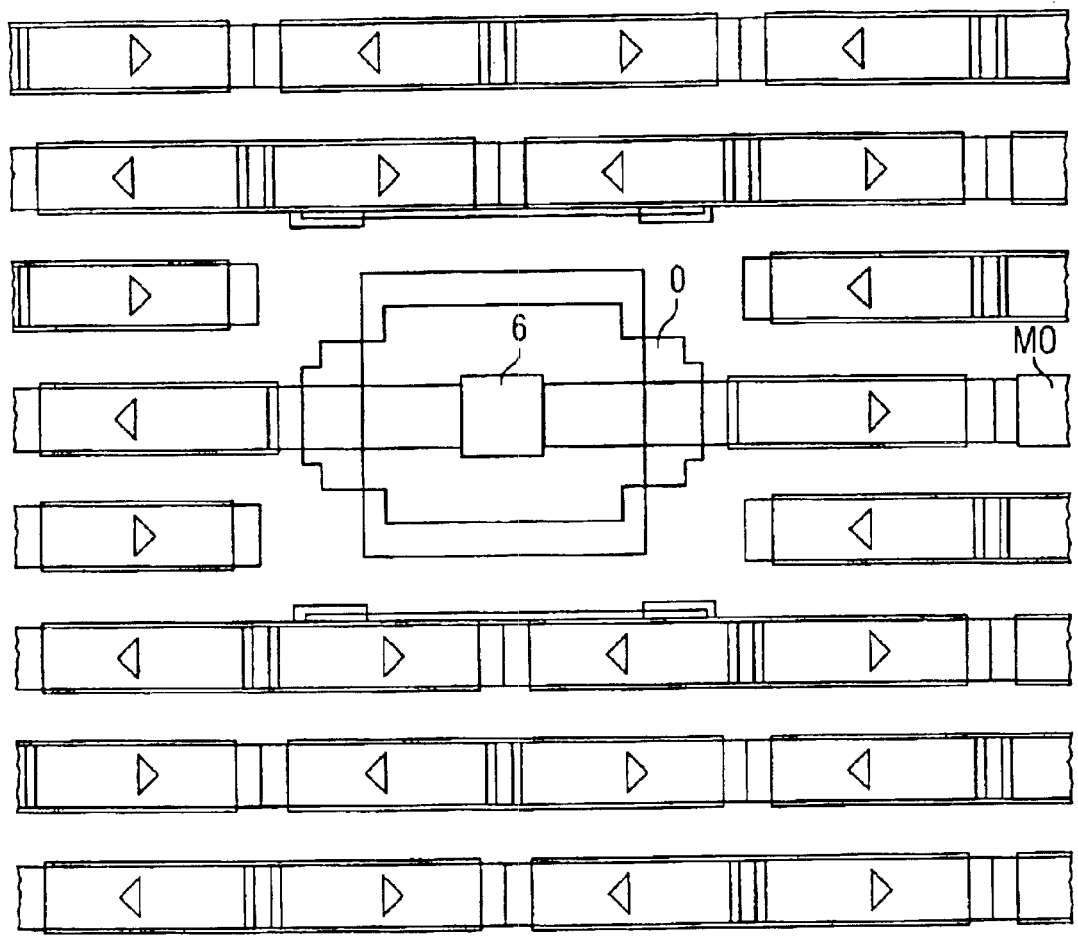
FIG. 5 is a plan view of possible wiring of the electrical test contact between the regular matrix configuration of four trench capacitors.

According to the invention, as shown in the plan view in FIGS. 3 to 5, a memory cell structure is formed in a very similar manner to the regular DRAM memory cell structure, i.e. with vertically running rows of rectangular storage capacitors and rows of active regions of selection transistors running horizontally with respect thereto. As shown by the plan view in FIG. 3, a regular matrix configuration of four trench capacitors 101, 102, 103, 104, between which a preferably quadrangular diffusion contact 6 is formed, is provided within the rows of trench capacitors. An active region 231 is provided in large-area fashion below the diffusion contact 6, as shown by the plan view in FIG. 4. The diffusion contact 6 is preferably contact-connected via a first metallization plane M0 of the memory chip and led, if appropriate, via contact bridges to an outer contact area that can be tapped by the needles of a needle card. FIG. 5 shows a possible metallization of the test structure for the connection of the diffusion contact 6 in the context of the first metallization plane M0.

Figure 2:
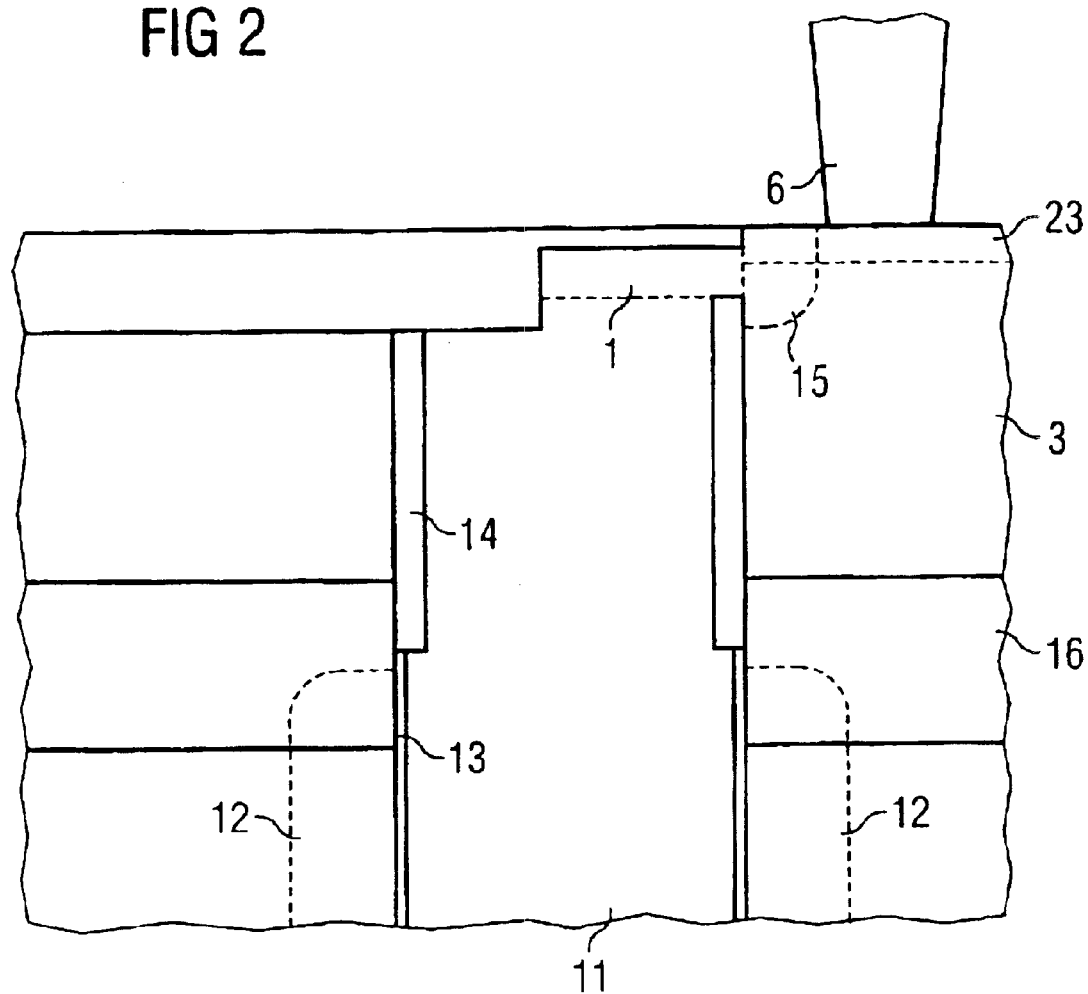
FIG. 2 is a cross-sectional view of a detail of a test structure according to the invention.

FIG. 2 illustrates a detail from a cross section through the test structure in the region of the diffusion contact 6 with an individual trench capacitor structure. FIG. 2 reveals that the trench capacitor of the test structure is identical to a regular DRAM cell as shown in FIG. 1. For this reason, the components of the trench capacitor in the test structure are provided with the same reference symbols as in the regular memory cell shown in FIG. 1. For testing, it is determined whether there is a short circuit between the diffusion contact block 6 and the buried strap 15. For this purpose, the contact block 6 is contact-connected preferably by a needle card independently of the four trench capacitors 101 to 104 of the test structure in FIGS. 3 to 5 and it is determined whether a current flow occurs between one of the trench capacitors and the diffusion contact block. In order to simplify the test, the trench capacitors 101 to 104 of the test structure are preferably connected to contact areas via contact bridges in order to facilitate the contact-connection of the trench capacitors.

From the knowledge of the position and size of the contact block 6 and the electrical measurement between the contact block 6 and the surrounding trench capacitors 101 to 104, the extent of the doping region of the buried straps 15 of the trench capacitors can be determined in a simple manner and non-destructively.

In this case, it is preferred to provide a series of test structures as are shown in FIGS. 2 to 5 in which the size of the contact blocks 6 between the four trench capacitors is varied. It is thus possible, through fine scaling of the contact area size, to perform a highly exact determination of the extent of the doping region of the buried straps. A further possibility for scaling relates in providing test structures with four trench capacitors that are spaced apart differently. As an alternative to the embodiment shown, it is also possible to perform any other desired configuration of the contact area 6 instead of the square contact structure shown.

We claim:

1. A test structure for a memory cell array having trench capacitors disposed in matrix form, for determining an extent of buried strap doping regions, a buried strap doping region, in a memory cell, serves as an electrode connection of an inner capacitor electrode of a trench capacitor with an associated selection transistor, the test structure comprising:

an electrical contact having a predetermined contact area and disposed between a regular matrix configuration of four of the trench capacitors, each of the trench capacitors having the inner capacitor electrode, a dielectric layer, an outer capacitor electrode isolated from the inner capacitor electrode by the dielectric layer and disposed around a lower trench region, and the buried strap diffusion region embodied as the electrode connection of the inner capacitor electrode disposed in an upper trench region.

2. The test structure according to claim 1, wherein the regular matrix configuration of four of the trench capacitors with said electrical contact disposed in between being embodied within a kerf region of the memory cell array.

3. The test structure according to claim 1, wherein the associated selection transistor has an active region dispose below said electrical contact between the regular matrix configuration of four of the trench capacitors.

4. A memory structure, comprising:

a substrate having trenches formed therein with lower trench regions and upper trench regions;

a memory cell array having trench capacitors disposed in matrix form in said trenches, selection transistors formed in said substrate, and buried strap doping regions each serving as an electrode connection for an inner capacitor electrode and disposed in said upper trench regions, said trench capacitors having inner capacitor electrodes, dielectric layers, and outer capacitor electrodes isolated from said inner capacitor electrodes by said dielectric layers and disposed around said lower trench regions; and electrical contacts having a predetermined contact area for determining an extent of said buried strap doping regions, each of said electrical contacts disposed between a regular matrix configuration of four of said trench capacitors for determining a short circuit between said inner capacitor electrodes and said outer capacitor electrodes.

5. The test structure according to claim 4, wherein said memory cell array has a kerf region and said regular matrix configuration with one of said electrical contacts disposed in between being embodied within said kerf region.

6. The test structure according to claim 4, wherein each of said selection transistors has an active region disposed below one of said electrical contacts between said regular matrix configuration of four of said trench capacitors.

7. The test structure according to claim 4, wherein said predetermined contact area varies in size between said electrical contacts.

8. The test structure according to claim 4, wherein said electrical contacts are each spaced differently from said trench capacitors.

9. A test structure pattern, comprising:

a plurality of test structure for a memory cell array having trench capacitors disposed in matrix form, for determining an extent of buried strap doping regions, a buried strap doping region, in a memory cell, serving as an electrode connection of an inner capacitor electrode of a trench capacitor with an associated selection transistor, said test structures each including:

an electrical contact having a predetermined contact area and disposed between a regular matrix configuration of four of the trench capacitors, each of the trench capacitors having the inner capacitor electrode, a dielectric layer, an outer capacitor electrode isolated from the inner capacitor electrode by the dielectric layer and disposed around a lower trench region, and the buried strap diffusion region embodied as the electrode connection of the inner capacitor electrode disposed in an upper trench region; and said electrical contact of each of said test structures having at least one of a different spacing between the trench capacitors and a different size of said contact area.

* * * * *